United States Patent
Kenington

(10) Patent No.: US 7,289,575 B1
(45) Date of Patent: Oct. 30, 2007

(54) SIGNAL PROCESSING MEANS

(75) Inventor: Peter Kenington, Chepstow (GB)

(73) Assignee: Andrew Corporation, Westchester, IL (US)

(*) Notice: Subject to any disclaimer, the term of this patent is extended or adjusted under 35 U.S.C. 154(b) by 867 days.

(21) Appl. No.: 09/913,368

(22) PCT Filed: Feb. 9, 2000

(86) PCT No.: PCT/GB00/00407

§ 371 (c)(1),
(2), (4) Date: Dec. 17, 2001

(87) PCT Pub. No.: WO00/48309

PCT Pub. Date: Aug. 17, 2000

(30) Foreign Application Priority Data

Feb. 12, 1999 (GB) ................................. 9903179.1

(51) Int. Cl.
H03F 1/30 (2006.01)
H03G 3/20 (2006.01)
H04L 25/49 (2006.01)

(52) U.S. Cl. .................... 375/296; 375/297; 330/144; 330/150

(58) Field of Classification Search ................ 330/149, 330/144, 151, 52; 375/297, 296
See application file for complete search history.

(56) References Cited

U.S. PATENT DOCUMENTS

| | | | |
|---|---|---|---|
| 3,772,617 A | 11/1973 | Ciesielka | 333/18 |
| 4,329,655 A * | 5/1982 | Nojima et al. | 330/149 |
| 4,580,105 A | 4/1986 | Myer | 330/149 |
| 4,929,906 A * | 5/1990 | Voyce et al. | 330/149 |
| 5,155,448 A * | 10/1992 | Powell | 330/149 |
| 5,166,634 A * | 11/1992 | Narahashi et al. | 330/151 |
| 5,334,946 A * | 8/1994 | Kenington et al. | 330/144 |
| 5,351,016 A * | 9/1994 | Dent | 332/103 |
| 5,420,536 A * | 5/1995 | Faulkner et al. | 330/149 |
| 5,770,971 A * | 6/1998 | McNicol | 330/52 |
| 5,796,304 A * | 8/1998 | Gentzler | 330/52 |
| 5,892,397 A * | 4/1999 | Belcher et al. | 330/149 |
| 5,910,965 A * | 6/1999 | Ierfino et al. | 375/220 |
| 6,081,156 A * | 6/2000 | Choi et al. | 330/52 |
| 6,101,228 A * | 8/2000 | Hebron et al. | 375/346 |
| 6,166,601 A * | 12/2000 | Shalom et al. | 330/151 |
| 6,298,097 B1 * | 10/2001 | Shalom | 375/297 |

FOREIGN PATENT DOCUMENTS

| | | |
|---|---|---|
| EP | 0 054 811 A | 6/1982 |
| EP | 0 289 130 | 11/1988 |
| EP | 0 544 117 A | 6/1993 |
| JP | 56085909 | 7/1981 |
| WO | WO 92/20146 | 11/1992 |

* cited by examiner

Primary Examiner—David C. Payne
Assistant Examiner—Linda Wong
(74) Attorney, Agent, or Firm—Steve Mendelsohn

(57) ABSTRACT

A non-linearity generator operates on a signal between a frequency converter and an amplifier and acts as a postdistorter for the component it follows and as a predistorter for the component it precedes, thus linearizing the overall input-output characteristic of the circuit. Cross-modulation components distorting an injected pilot signal provide a feed-back signal that is used to control the distortion applied by a non-linearity generator. The non-linearity generator can be adapted to cope with widely spaced input tones. The circuit may form part of a transmitter or a receiver.

31 Claims, 17 Drawing Sheets

SIGNAL PROCESSING MEANS

FIELD OF THE INVENTION

This invention relates to signal processing apparatus of the kind in which an input signal is subject to both amplification and frequency conversion; and especially relates to radio telecommunications apparatus in which a voice signal is subject to amplification and frequency conversion either in a reception process or transmission process.

BACKGROUND OF THE INVENTION

The emerging GSM-EDGE and UMTS standards for mobile telecommunications place an increasingly stringent requirement on the linearity of handsets, particularly given their proposed wider channel bandwidths. In order to realise a power-efficient handset design, some form of linearisation will be required in the handset transmitter which should be (i) low-power itself; (ii) capable of broadband linearisation (up to 5 MHz for UMTS/ULTRA; (iii) frequency flexible, and preferably multi-band; and (iv) capable of achieving and maintaining high-levels of linearity improvement with highly-non-linear power amplifiers (e.g. class-C).

This increasing dynamic range requirement, also has an effect on the RF front-end systems of both handsets and base stations. In the case of handsets, the use of software radio techniques, with the requirement for adaption between many different channel and system bandwidths over a wide range of operating frequencies, leads to a desire to remove RF front-end filtering. The alternative solution of switchable or tuneable filters either results in poor filter performance or an unrealistic number of separate filters. Without a front-end filter, a wide range of signals, both very strong and very weak, can enter the receiver. These must be processed (i.e. amplified and down converted) without undue distortion that might produce unwanted intermodulation products on the wanted channel that mask the wanted signal. Thus, a front-end with a good noise figure and a high intercept point is required.

In the case of base-station systems, these are typically designed for a single frequency band, but are required to operate in a harsh radio environment, with the transmitters from other, unrelated systems being sited close by (often on the same mast). This results in large unwanted signals impinging upon the receiver system, which signals have been removed using large and expensive filtering.

The invention is also applicable to adaptive antenna systems. Such systems are currently implemented using RF gain and phase-shifting components (often in a "Butler Matrix" configuration) and this arrangement requires these components to operate at high power levels and is therefore less than optimum in performance. A new and better method of implementing the gain and phase shifting elements involves the processing of all signals from a base-station (in a composite multi-carrier form) at baseband. The gain and phase controls can then be implemented easily (e.g. in a digital signal processor DSP) and this will become increasingly attractive as DSP technology improves. However, to be successful, there is a requirement for very high linearity multi-carrier upconversion and power amplification.

SUMMARY OF THE INVENTION

Signal processing apparatus according to the present invention comprises signal amplification means and frequency conversion means which operate in succession on an input signal, characterised in that linearisation means is provided between the amplification means and the frequency conversion means to introduce a correction signal that is adapted to make the overall input and output characteristic of the apparatus more linear.

As applied to the transmitter of mobile telephone handsets, the linearisation means is located between the output of the RF frequency upconverter and the input to the RF power amplifier, and is adapted to act as a predistorter in relation to the amplifier. A pilot signal is used to create intermodulation distortion in the amplifier, which is used as a control signal to set the predistorter for optimum linearisation. Preferably, this pilot signal is introduced at the input to the upconverter so that it passes with the input signal through both the upconverter and amplifier, and thereby serves to control linearisation of the apparatus overall. The linearisation means then effectively acts as a postdistorter in relation to the upconverter. A similar configuration of linearisation means can be used in adaptive antenna systems.

As applied to the receiver of mobile telephone handsets, the linearisation means is located between the output of the RF amplifier and the input of the downconverter, and is adapted to act as a predistorter in relation to the down converter, and as a postdistorter in relation to the amplifier by virtue of use of a pilot signal that passes with the input signal through both the amplifier and downconverter and serves to control setting of the linearisation means for overall optimum linearisation. A similar configuration of linearisation means can be used in relation to the receiver of a base station.

BRIEF DESCRIPTION OF THE DRAWINGS

Some embodiments of the invention will now be described, by way of example only, with reference to the accompanying drawings, in which.

DETAILED DESCRIPTION

Figure 1:
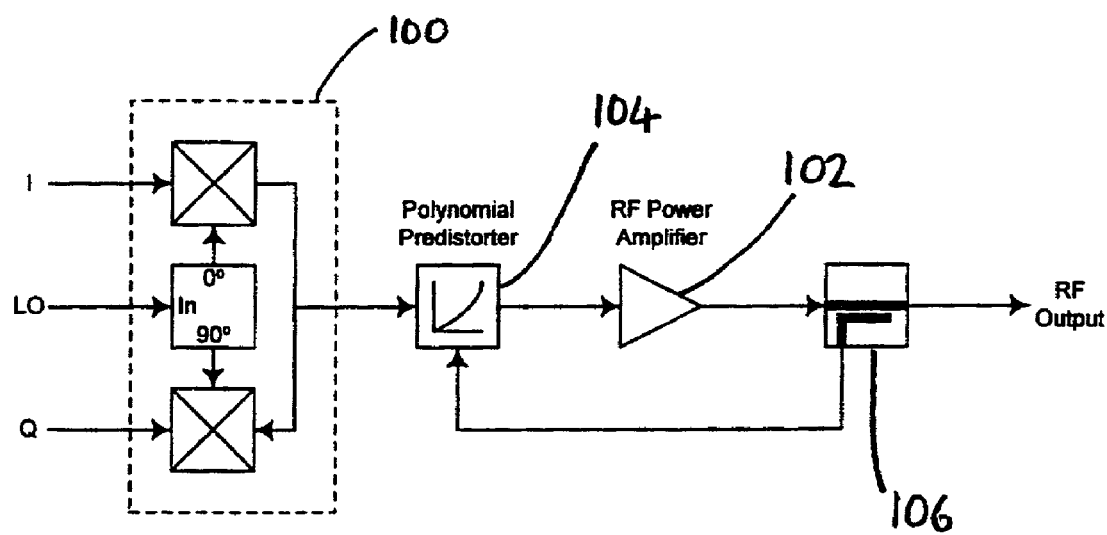
FIG. 1 shows a basic configuration of a RF predistortion linearisation scheme.

FIG. 1 illustrates the basic configuration of a mobile telephone handset transmitter comprising an RF upconverter 100 with I and Q inputs to receive the in-phase I and quadrature Q components of a quadrature amplitude modulated signal from a voice or data signal generator. The upconverter 100 modulates the I and Q signals onto a signal from a local oscillator LO, and an RF power amplifier 102 amplifies the output signal from the upconverter and delivers an RF output signal to the handset antenna.

In order to give the upconversion/RF amplification circuit a more linear characteristic, a polynominal predistorter 104 is incorporated in the signal path between the output of the upconverter 100 and the input of the amplifier 102. The predistorter 104 generates from the input signal, a polynominal predistortion signal which is combined with the input signal and fed to the RF amplifier 102, and a sampling coupler 106 in the output of the amplifier feeds back a portion of the RF amplifier output to the predistorter 104 to control the predistortion signal so as to produce a more linear output.

The feedback control signal is based on non-linear components in the output signal appearing as cross modulation on a pilot signal passing through the amplifier 102 with the modulated RF signal. The pilot signal is introduced at the I and Q inputs of the upconverter 100 so that it experiences distortion in the upconverter, which can therefore also be cancelled by operation of the predistorter 104. Thus, the predistorter 104 also acts effectively as a "post-distorter" for the upconverter 100.

In the embodiment of FIG. 1, the predistorter 104 needs to be a quadrature system (as will be described below with reference to FIG. 4) in order to linearise a non-linear signal to a high degree of linearity.

Figure 2:
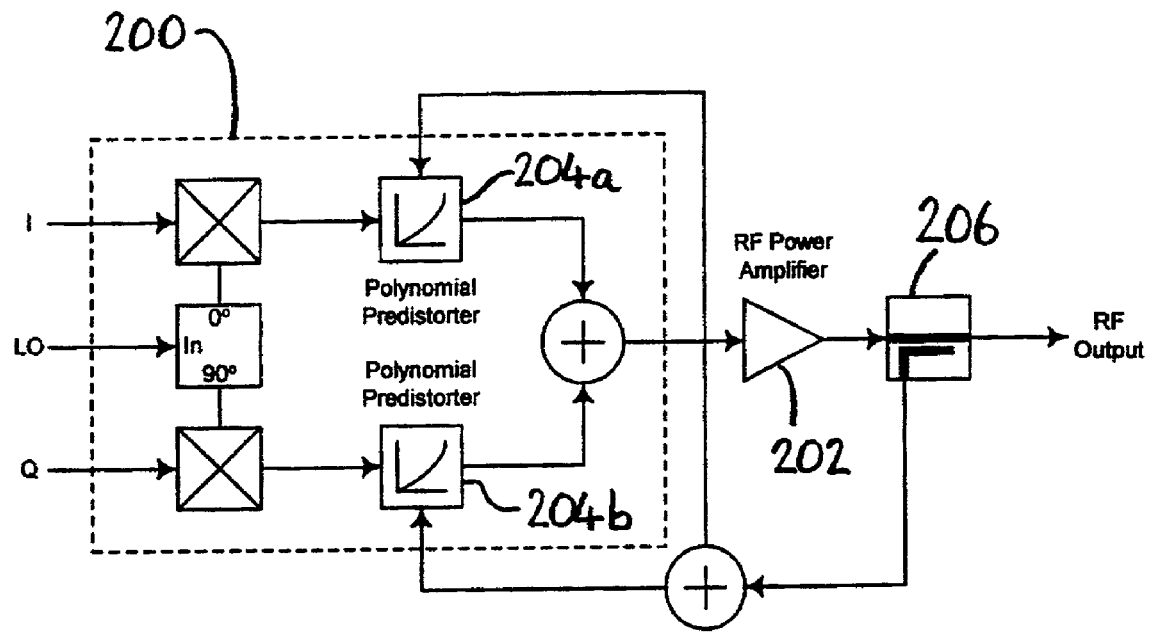
FIG. 2 shows a quadrature configuration of a RF predistortion linearisation scheme.

In the embodiment of FIG. 2, a quadrature configuration is adopted for the RF distortion linearisation scheme. As can be seen in FIG. 2, the predistortion function is brought into the upconverter 200 by incorporating a predistorter 204a, 204b, in each of its arms. The advantage of this arrangement is that the quadrature generation may be accomplished simply by means of a conventional frequency doubler/divider arrangement on the local oscillator signal L0, for example, which means that an integrated circuit implementation could be broadband and would not require a quadrature hybrid splitter, or the like. In contrast, the predistorter of FIG. 1 would need to be a quadrature system in order to linearise a non-linear amplifier to a high-degree of linearity. The quadrature splitting arrangement would have to operate on the modulated carrier and hence could not be a doubler/divider arrangement and would prove more difficult to integrate successfully, particularly for a broadband system.

For a pilot signal to be useful in predistorter control, it must create intermodulation distortion when passing through the power amplifier to be linearised or it must have the modulation and distortion from the "wanted" signals passing through the amplifier transferred onto it by "cross-modulation". Cross-modulation is a well known problem, caused by receiver non-linearity, resulting in the amplitude modulation present on one, usually high level, received signal to be "transferred" as an interfering amplitude modulation onto another (weaker) signal. In other words, the pilot signal could contain amplitude and phase modulation or it may simply be a CW signal onto which cross-modulation can occur. There is clearly a wide range of possible signals which fall into this category; some obvious examples are a CW carrier; full-carrier AM; suppresed-carrier AM; single-sideband (SSB); QAM; filtered QPSK; frequency-hopped carrier modulated with any of the above; and two-tone signals as described below.

A CW pilot signal is an advantageously simple pilot signal and may be used since the amplifier non-linearities will result in cross-modulation of the input signal envelope onto the CW signal. Once the predistorter has adapted and the non-linearity has been eliminated, this cross-modulation will no longer occur, hence allowing adaption of the predistorter to be based on elimination of cross-modulation.

There is also a large range of possible two-tone pilot signals, the simplest of which is a pilot signal comprising two CW tones. This is described in more detail below.

Direct-sequence spread-spectrum signals may also be used for the pilot signal. The use of one or two spread-spectrum signals has the advantage of spreading the pilot signal energy over a wide bandwidth, hence potentially reducing the amount of cancellation of the pilot required at the output, in order to meet a given specification (e.g. 75 dBc). If these signals appear in-band, however, then the required injection level to meet a given control system signal-to-noise ratio is much higher, hence potentially removing the benefit of using spread signals. In addition, the pilot cancellation process becomes broadband and hence the achievable pilot cancellation performance will be limited.

A frequency-hopped narrowband two-tone signal may also be used as a pilot signal. This has an advantage over the use of two CW tones in that it may be placed in-band, with hopping providing sampling across a range of relevant frequencies. These could be arranged so as not to coincide with the wanted signals passing through the amplifier or could be hopped randomly, with any "clashes" being averaged out with the majority of "no-clash" hops.

It is also possible to use multitone and other types of pilot signal.

Figure 3:
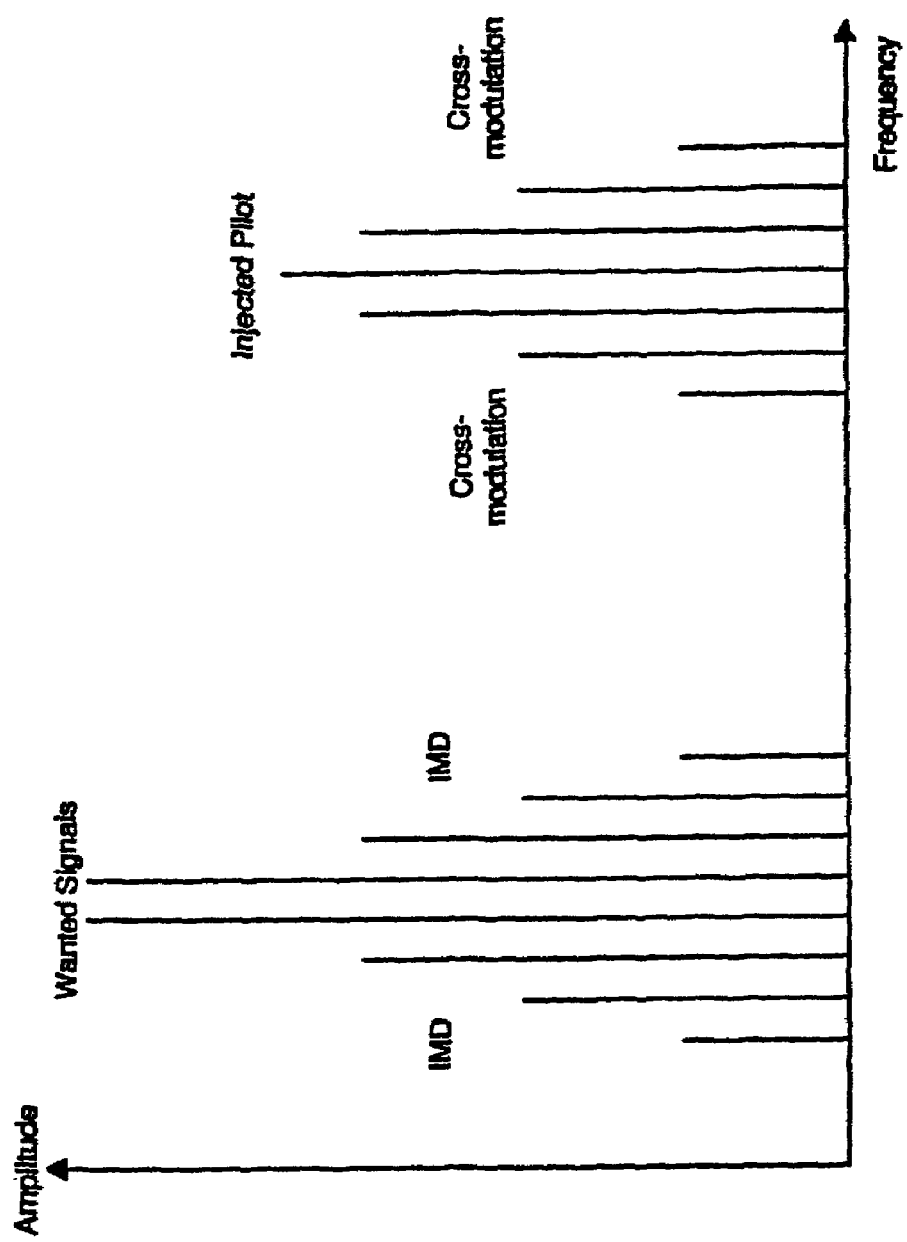
FIG. 3 shows a spectrum resulting from an injected continuous wave (CW) pilot (before linearisation of the amplifier)

The operation of a predistorter using CW pilot-based control such as might be used in a handset transmitter will now be described. The basic concept of operation is to obtain a measure of the non-linearity present in the upconverter and the amplifier by injecting a CW pilot signal along with the wanted input signals, and examining the cross-modulation components imposed upon it due to the non-linearity present in the amplifier/upconverter. A typical spectrum of this approach is shown in FIG. 3. The cross-modulation components around the CW pilot signal represent all relevant orders of distortion present in the amplifier (shown up to 7th order in FIG. 3) and hence may be used as a measure of each order of distortion individually, assuming that this information can be detected individually.

Since the pilot signal passes through both the non-linear amplifier and upconverter, as the predistorter adapts and the overall system linearity is improved, so the cross-modulation present on the pilot signal will decrease. This cross-modulation therefore provides a measure of the non-linearity present in the system.

An advantage of using a pilot signal is that it is injected at a known frequency and hence it may be detected or downconverted using the original pilot signal frequency, or a frequency related to this pilot frequency (e.g. the local oscillator used in its generation). Thus, the distortion information may be translated to a convenient frequency for detection, irrespective of the number or frequencies of the wanted input signals.

The pilot-tone will not naturally be cancelled by the action of the predistorter and hence it must be explicitly cancelled by a separate cancellation loop. With this in mind, it is a significant advantage if the pilot signal can be narrow-band, as this allows very high degrees of cancellation to be achieved without recourse to extreme gain and phase flatness characteristics in the main RF power amplifier which are difficult and expensive to achieve. Clearly, a CW signal is the ultimate in narrow-band signals and hence fulfils this requirement ideally.

Although pilot cancellation can be achieved with a cancellation loop, in the case of the predistorter/lineariser being embodied in a receiver front-end, the pilot frequency may be chosen such that it falls outside of the intermediate frequency IF (or baseband) bandwidth facilitating its removal using the IF (or baseband) filtering. No additional components are therefore required for pilot removal, thus rendering the pilot-based technique simpler. This will be discussed in greater detail below in relation to the embodiments of FIGS. 10,11 and 12.

The predistorter will contain non-linear elements for generating the non-linearities on which the predistortion is based. The non-linearities may be created in a number of ways, e.g. anti-parallel diodes, an FET channel, dual-gate GaAs FETs operating close to pinch-off, Schottky diodes and analogue mixing/multiplication, although it is advantageous if the various orders of distortion are generated independently, in order for them to be controlled independently.

One possible mechanism by which these orders of distortion may be generated independently is disclosed in our co-pending application GB9804745.9. This application also discloses the mechanisms by which even-order baseband components may be generated as a by-product of the odd-order non-linearity generation. Briefly, a predistorter input signal is mixed with itself the requisite number of times to generate the non-linearity of the desired order. For example, the input signal can be mixed with itself to generate a second order (square) non-linearity which can be mixed with the input signal once more in order to generate a third order (cubic) non-linearity.

In the case of a receiver, the pilot signal should ideally be placed outside of the IF or baseband bandwidth of the receiver system in question, but sufficiently close to the band of interest to ensure good correlation between pilot-intermodulation distortion and that of the wanted signals. This can most easily be ensured by generation of a pilot at the desired frequency offset and then upconverting this pilot using the same local oscillator(s) used for the receiver downconversion process(es).

The other desirable feature of the pilot placement is that it should not appear coincident with a strong input signal. This could be ensured in a number of ways, depending upon the system characteristics. One example would simply be to place the pilot in the guard-band between channels, where it should suffer minimal interference.

In the case of a single-channel system (e.g. a handset transmitter), the choice of pilot frequency is potentially complex. There are three possibilities for positioning the pilot signal. The pilot signal could be located at:
  (a) the band centre. This has the advantages that it is easy to do, easy to cancel, and that cancellation does not need to be spectacularly good. However, a small amount of the required modulation will be removed from the channel centre and this could be a problem with long strings of 1's or 0's in some digital modulation formats. Furthermore, the amplitude of the pilot will need to be quite large as the cross-modulation will need to be detected in amongst a large amount of cross-correlation noise.
  (b) a tone above or below channel (but still within the spectral mask). This gets around the modulation removal problem, reduces cross-correlation noise but may have a higher pilot cancellation requirement and there may be a pilot image problem. (However, this may be negligible due to pilot position within the spectral mask)
  (c) a tone well above or below the wanted channel. There is no modulation removal problem and no dependence on the specifics of the spectral mask. The pilot cancellation requirement is the most stringent and the image cancellation problem is considerable. Furthermore, separate pilot and image cancellations may be necessary.

This latter option is, however, the most "general" location for the pilot signal, since it can be fixed based on the widest channel bandwidth for a given system and does not need to be changed with each system to be accommodated (e.g. in a flexible architecture or "software" radio handset). For example, if the widest channel bandwidth requirement was 5 MHz (i.e. +/−2.5 MHz from the channel centre frequency), then the pilot signal could be placed at, say 3 MHz from channel centre and this would be valid for channel bandwidths from a few kHz up to the design maximum of 5 MHz.

Removal of the pilot using a separate upconversion mechanism (for the "clean" pilot signal) leads to the potential for differences between the injected and cancellation pilots and hence the possibility of imperfect pilot cancellation in the output signal.

Imperfections in the main upconverter will lead to the pilot signal also having an "image" signal an equal frequency spacing from the carrier, but on the opposite side. If an identical upconverter were used for the cancellation pilot, then the errors would be the same and hence an equivalent level of pilot and image would be generated. This would then allow ideal cancellation of the pilot and its image to take place (under appropriate automatic control).

If the cancellation pilot is formed by a separate upconversion of the baseband pilot signal, the possibility of differential errors between the two upconversion processes is introduced. These errors are, however, minimised in the case of an integrated circuit implementation of the system since: (1) all of the upconversion mixers in the two upconversion processes can be fabricated on the same IC so that the matching between them will be enhanced due to the tight matching tolerances inherent in the integrated circuit processes; and (2) the same quadrature generation process is used in both cases (i.e. for both upconversion processes) and hence quadrature phase errors will be identical between the two and the quadrature local oscillator amplitudes should also be identical. This eliminates two of the main sources of error between the two processes and hence leaves only (1) above as the main source of error.

If it is necessary to provide additional cancellation of the image signal, then this can easily be arranged by a second "cancellation pilot" which could be formed from a further quadrature upconversion process, with the pilot signal now appearing on the "image" frequency and control being provided by a second control process.

In the case of a pilot signal with a high frequency offset from the channel centre (e.g. the 3 MHz mentioned above), it may not be advantageous to include the pilot oscillators within the DSP that forms the predistorter. This is because the signal processing overhead required would be very large, increasing the speed and power consumption of the DSP device and its associated ADC and DAC parts. An alternative mechanism would involve external generation of a CW pilot signal (e.g. at 3 MHz) and image-reject mixing it with an offset tone provided by the DSP at an appropriate audio frequency (e.g. 1 kHz). This would generate the offset pilot and both signals could be quadrature split using a number of known techniques (e.g. quadrature hybrid, frequency doubling and dividing, all-pass filtering etc.). The result of this external pilot generation would be that the DSP would only need to operate on audio frequency signals and could be a very low-cost, low-power device. In a practical handset, the required algorithms could be executed by the DSP already present in the handset for modulation and demodulation of the wanted signal. Additional hardware would therefore be restricted to the ADC and DAC converter parts.

One convenient method of generating an appropriate external pilot signal is dividing down of the clock signal for the DSP or microprocessor.

Figure 4A:
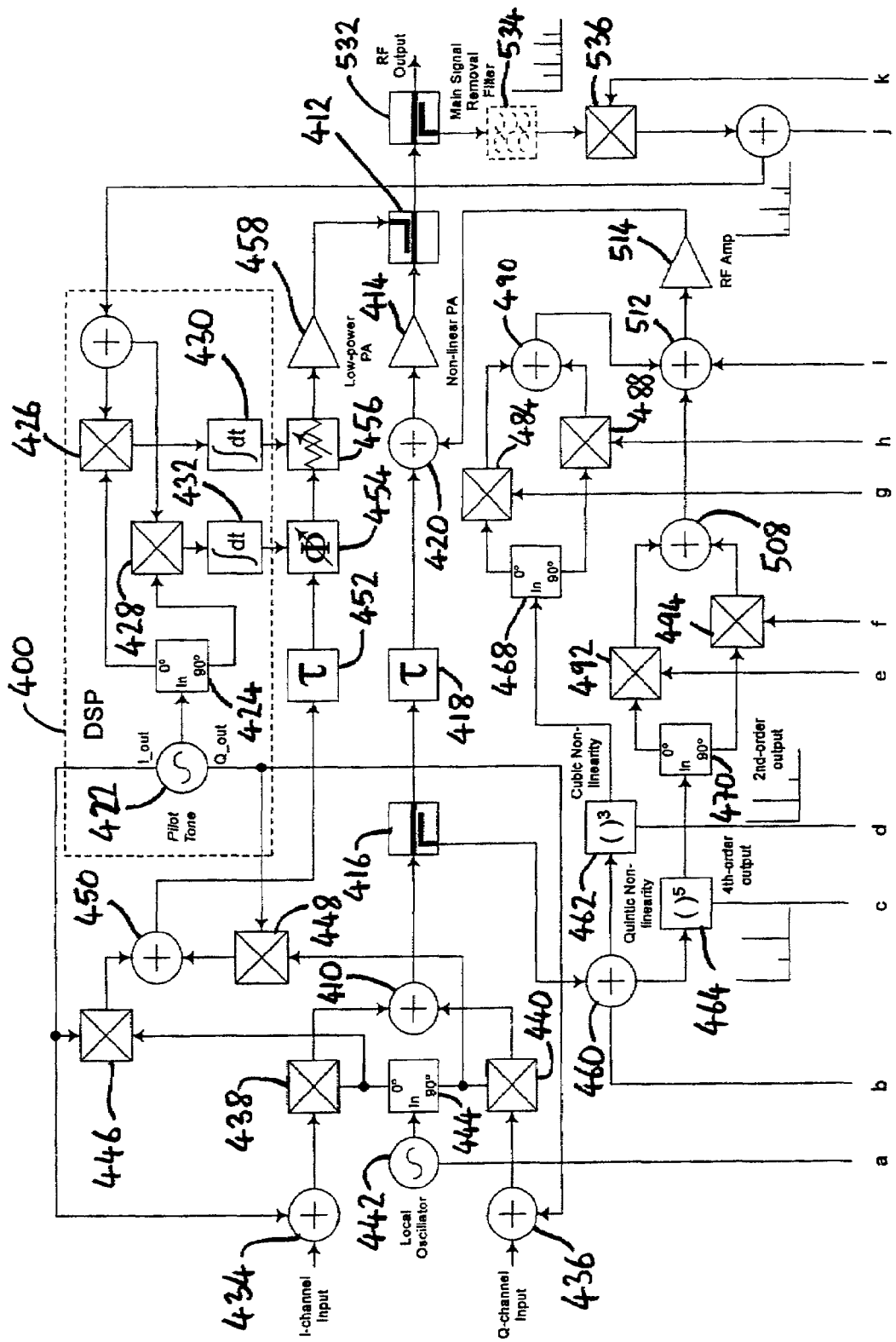
FIGS. 4a and 4b show a CW pilot signal based multi-order vector predistorter.
Figure 4B:
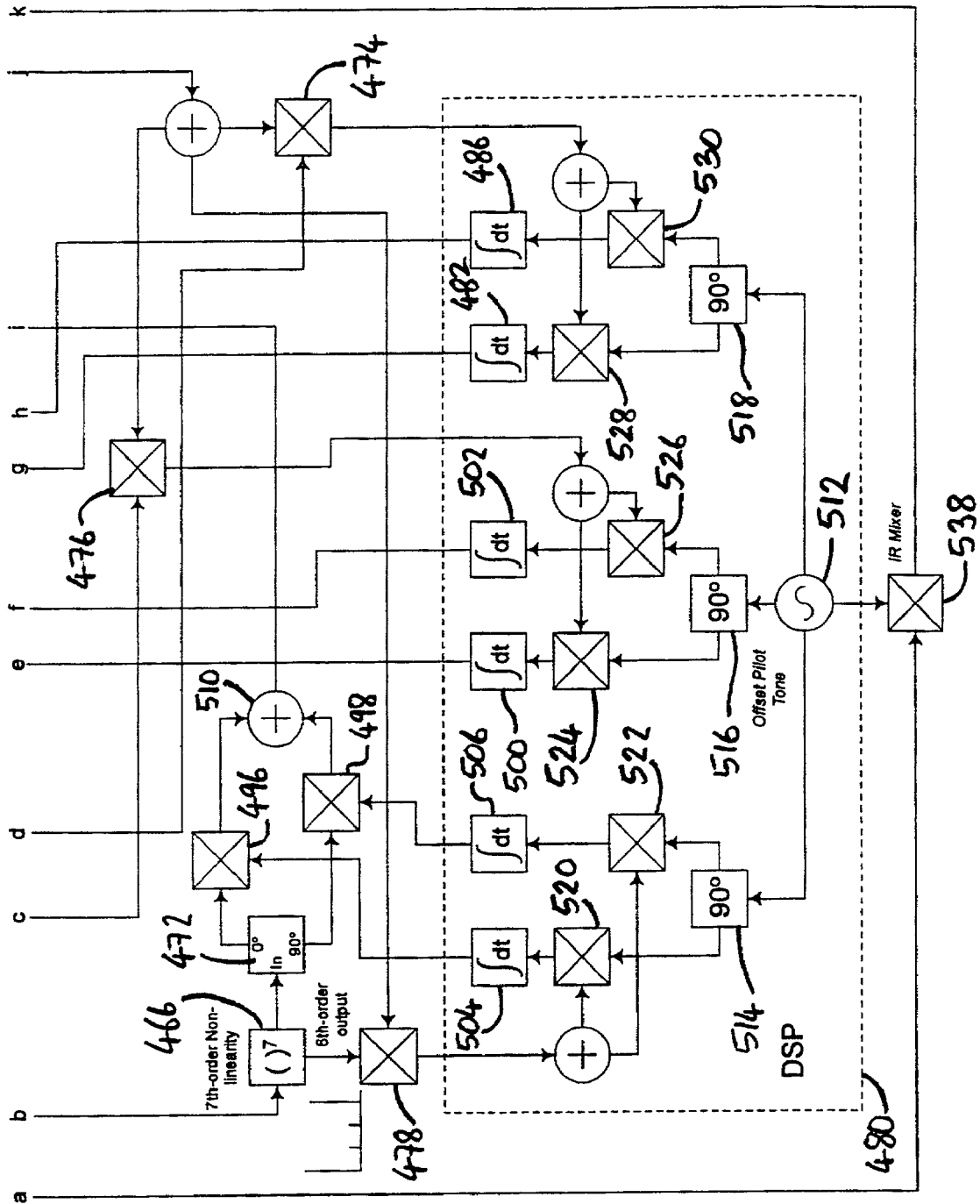

FIG. 4 shows a multi-order vector predistorter with post-distortion linearisation of the upconverter and predistortion linearisation of the RF power amplifier chain. Each order of the distortion is independently controlled by means of the relevant order of distortion from the non-linear generator and this principle can be extended to higher orders of distortion by obvious extensions to this figure, e.g. ninth order nonlinearity generators could be included.

The multi-order vector predistorter of FIG. 4 comprises a digital signal processor 400 which generates a CW pilot signal, which is injected into the I and Q inputs of the upconverter (the output of which is provided by adder 410), and a pilot cancellation signal, which is injected into the mains signal path via coupler 412 following the non-linear RF power amplifier 414. A portion of the upconverter output 410 is extracted at coupler 416 for use in the predistortion generation process (described below). Another portion of the upconverter output 410 passes through the coupler 416 and continues along the main signal path through delay line 418 to adder 420 where it is combined with the distortion produced by the predistortion circuitry in order to generate a predistorted input signal to the non-linear RF power amplifier 414. The delay line 418 compensates the main signal path for the delay in the predistortion circuitry. The linearised output of the non-linear RF power amplifier 414 then passes through coupler 412 where the pilot signal is removed from the main signal path by the injection of a pilot cancellation signal which is controlled by the digital signal processor 400. The signal emerging from coupler 412 provides the linearised RF output of the circuit.

The DSP 400 comprises a pilot tone generator 422 which produces I and Q output signals and which also supplies the pilot tone to a quadrature signal generator 424. The inphase signal from the quadrature generator 424 is supplied to a first mixer 426 and the quadrature signal is supplied to a second mixer 428. A signal derived from feedback from the linearised RF output is supplied to the other input of each mixer 426 and 428. The outputs of these mixers are supplied to integrators 430 and 432 respectively, which provides signals that are used to control the pilot cancellation signal. The inphase and quadrature pilot signals I_out and Q_out, produced by pilot tone generator 422 are added into the signals supplied to the I and Q inputs of the upconverter at 434 and 436 respectively. The output of adders 434 and 436 are fed to mixers 438 and 440 respectively. A signal from a local oscillator 442 is supplied to a quadrature generator 444 which supplies inphase and quadrature signals to the remaining inputs of mixers 438 and 440 respectively. The outputs from these mixers are then combined at adder 410 to produce the upconverted RF signal. A portion of the upconverted RF signal is tapped from the main signal path at 416 to provide an input to the predistortion generating circuitry which compensates for the non-linearities of the upconverter and the non-linear RF power amplifier 414.

To generate the pilot cancellation signal, the inphase and quadrature signals produced by quadrature generator 444 are supplied to inputs of mixers 446 and 448 respectively. The inphase (I_out) and quadrature (Q_out) signals produced by the pilot tone generator 422 of the DSP 440 are supplied to the other inputs of the mixers 446 and 448 respectively. The outputs of mixers 446 and 448 are then combined at adder 450 to produce an upconverted pilot tone signal which is supplied to a delay line 452 which matches the pilot cancellation signal with the main signal as delayed by delay line 418. The output from delay line 452 is manipulated by phase controller 454 and amplitude controller 456 which are controlled, respectively, by the output of integrators 432 and 430 of the DSP 400. The resultant amplitude and phase controlled upconverted pilot signal is then amplified by low power amplifier 458 in order to produce the pilot cancellation signal which is injected into the main signal path at coupler 412. As will be appreciated, the DSP 400 monitors the feedback from the linearised output to adjust the phase and amplitude of the pilot cancellation signal in order to attain the required degree of pilot signal cancellation at the output side of the circuit.

Considering now the predistorter circuitry, the portion of the upconverted signal removed at coupler 416 is supplied via splitter 460 to cubic, quintic and seventh order non-linearity generators 462, 464 and 466 respectively. Each of these non-linearity generators produces a non-linearity of the required order and a non-linearity one order less than the required order. For example, the seventh order non-linearity generator produces a seventh order non-linearity and a sixth order non-linearity. The non-linearities of the required order produced by each of the non-linearity generators 462, 464 and 466, are supplied to quadrature signal generators 468, 470 and 472, respectively. The non-linearities one order lower than the required orders are input to mixers 474, 476 and 478, respectively. The signals produced by the quadrature signal generators 468, 470 and 472 are then mixed into signals supplied by digital signal processor 480. For example, the inphase signal produced by the quadrature signal generator 468 operating on the cubic non-linearity supplied by the third order non-linearity generator 462 is mixed into a signal from integrator 482 of DSP 480 by mixer 484. Similarly, the quadrature signal from quadrature signal generator 468 is mixed into the signal from integrator 486 of DSP 480 by mixer 488. The outputs from the mixers 484 and 488 are then combined by adder 490. In a similar manner, the inphase and quadrature signals produced by each of quadrature signal generators 470 and 472 are acted upon by, respective, pairs of mixers 492 and 494, 496 and 498, DSP integrator signal pairs 500 and 502, 504 and 506, and adders 508 and 510. The outputs from the adders 490, 508 and 510, are combined using adder 512, the output of which is amplified by RF amplifier 514 which in turn supplies the distortion signal for combination with the upconverted signal in the main signal path at adder 420 in order to produce the predistorted signal input for the non-linear RF power amplifier 414.

The distortion necessary to linearise the output of the overall circuit is controlled by the signals provided by integrators 482, 486, 500, 502, 504 and 506 in the DSP 480. The DSP controls the nature of the distortion in accordance with feedback signals from the RF output of the whole circuit. The DSP generates a CW off set pilot tone, at 538, which is supplied to quadrature signal generators 513, 516 and 518. Quadrature signal generator 513 supplies inphase and quadrature signals derived from the offset pilot tone to mixers 520 and 522, respectively, where they are each separately mixed into a signal from mixer 478 to produce, respectively, the inputs for integrators 504 and 506. Similarly, the inphase and quadrature signals produced by quadrature signal generator 516 are used to produce the inputs to integrators 500 and 502 using mixers 524 and 526 and the output from mixer 476. Similarly, the inphase and quadrature signals output by quadrature signal generator 518 are used to produce the input signals to integrators 482 and 486 of the DSP 480 using mixers 528 and 530 in conjunction with the output of mixer 474.

A feedback path from the RF output to the predistorter circuitry is provided by way of coupler 532 which channels a portion of the RF output signal into filter 534. Filter 534 removes the linearised main signal and, although not essentially, most of the IMD components of the main signal and passes the pilot-tone cross modulation distortion to mixer 536. At mixer 536, this residual distortion is mixed with a pilot tone signal generated by the IR (image reject) mixer 538 in combining the outputs of the local oscillator 442 and the offset pilot tone generator 512 in the DSP 480. The output signal from mixer 536 is provided as a feedback signal to the mixers 426 and 428 in DSP 400 responsible for controlling the pilot cancellation signal. The output from mixer 536 is also supplied to inputs of mixers 474, 476 and 478, where it is mixed into the second, fourth, and sixth order non-linearities to produce input signals for mixer pairs 520 and 522, 524 and 526, and 528 and 530, respectively. The signal output by the mixer 536 contains information regarding the cross-modulation distortion imposed on the pilot signal by the main signal, and the DSP 480 utilises this signal to adjust the predistortion signal to suppress the cross-modulation imposed on the injected pilot, and hence the intermodulation distortion experienced by the wanted output signals. Thus, a signal originating from the RF output as passed by filter 534 and representing any residual distortion in the output, is used to adapt both the distortion generated by the predistorter and also the pilot cancellation signal.

Figure 5:
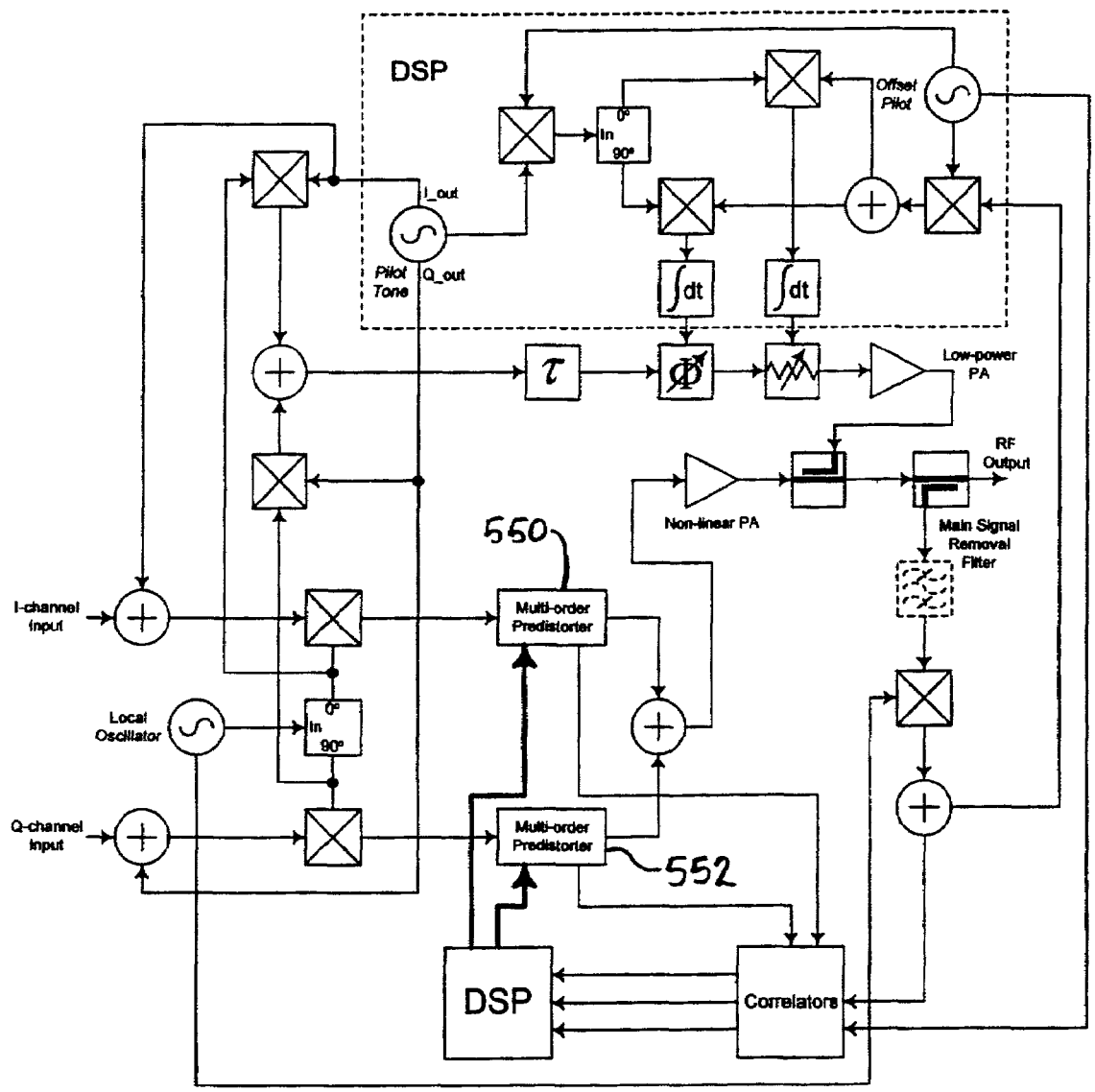

An alternative circuit, this time for providing quadrature predistortion in a handset transmitter, is shown in FIG. 5. Here, the quadrature predistortion function is provided by separate predistorters 550, 552, in the quadrature paths of the upconverter. This has the significant advantage that the quadrature generation process is provided on a single CW signal (the local oscillator) and hence may be performed conveniently over a very broad bandwidth using known doubler/divider techniques. This significantly enhances the frequency flexibility of the technique. The arrangement shown in FIG. 4, on the other hand, requires a number of quadrature splitting processes 468, 470, 472, all of which must operate on a band of signals and which cannot, therefore, employ non-linear doubler/divider techniques.

Figure 6A:
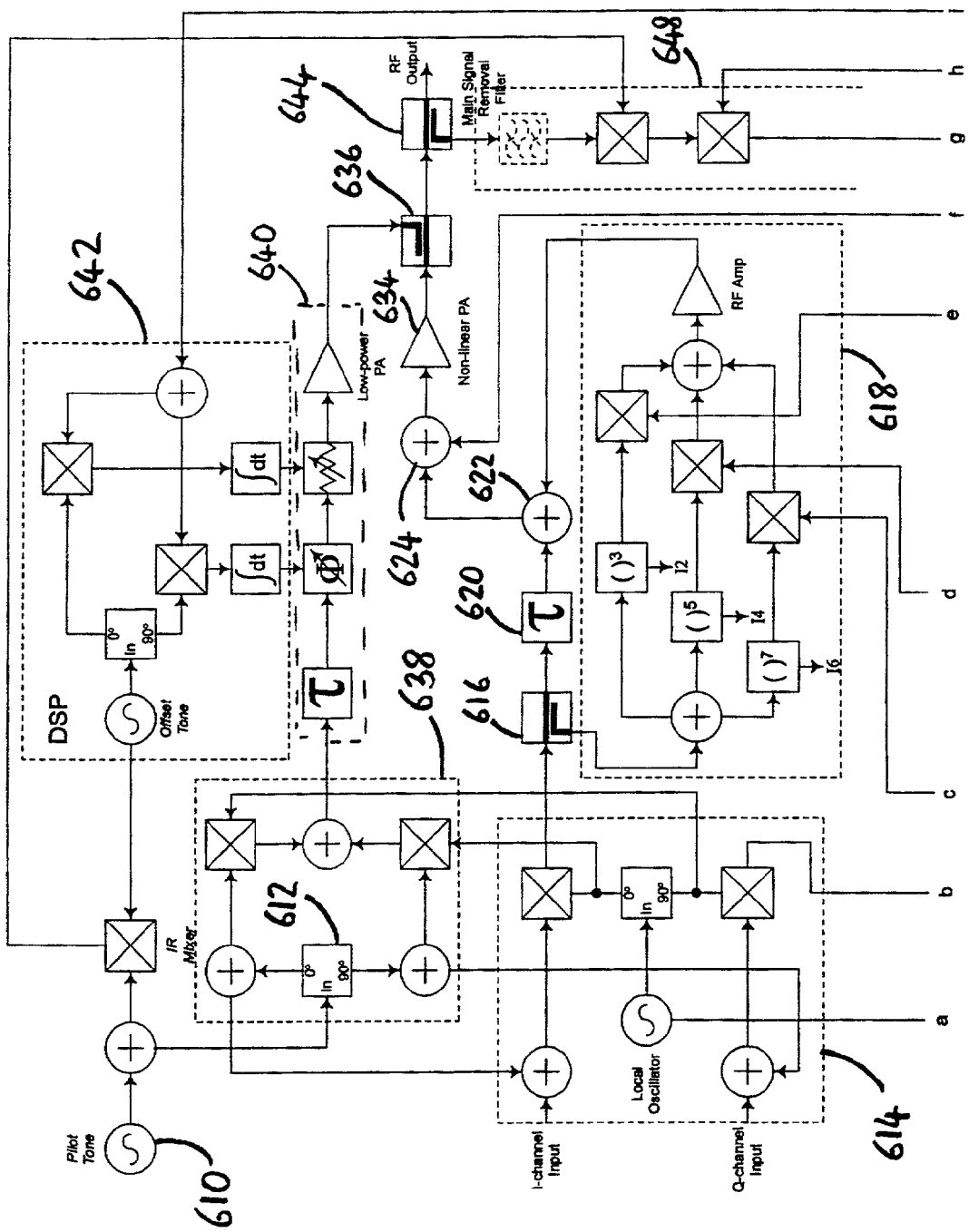
FIGS. 6a and 6b show a more detailed diagram of the circuit of FIG. 5.
Figure 6B:
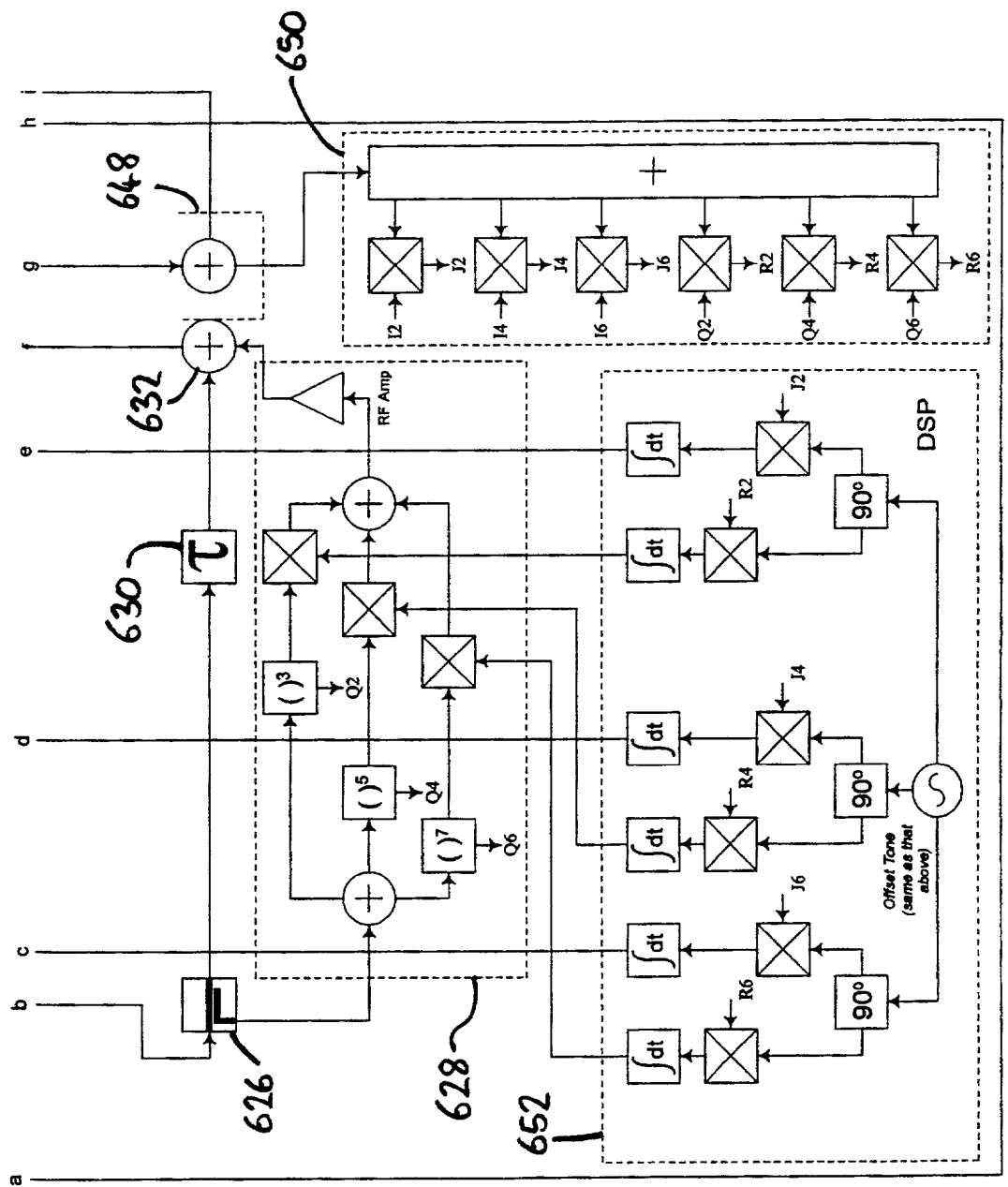

A more detailed version of the CW pilot-signal based multi-order vector predistorter of FIG. 5, is shown in FIG. 6, including the use of an external pilot-tone oscillator (e.g. formed by dividing down of a sample of the DSP clock oscillator).

Note that the quadrature splitter 612 following this oscillator 610 may already be present in the IR mixer (depending upon its configuration) and hence only one would be required (with appropriate 0 degree signal splitting).

The quadrature signals derived from the pilot tone generator 610 by quadrature splitter 612 are combined with the inphase and quadrature inputs to the upconverter stage 614. The output from the mixer in the I channel of the upconverter stage 614 is fed to a splitter 616 which directs a first portion of the signal into a non-linearity generator 618 and a second portion of the signal into a delay line 620. The signals from the delay line 620 and the non-linearity generator 618 are combined by adder 622 which outputs the resultant signal to adder 624 which can be considered to be the final stage of the input signal upconverter. Similarly, the output from the mixer in the Q channel of the input signal upconverter stage 614 is supplied to a splitter 626 which feeds a portion of the received signal to a non-linearity generator 628 and a second portion of the received signal to a delay line 630. Adder 632 serves to recombine the outputs of delay line 630 and the non-linearity generator 628, and feeds a resulting signal to adder 624. It will be apparent that the predistortion signal is thus injected into the input signals during the upconversion process.

The predistorted RF signal from adder 624 provides the input to the RF amplifier 634 to be linearised. The pilot signal is then removed from the output by injection of a pilot cancellation signal at coupler 636. It will be apparent that the pilot cancellation signal is provided by means of the pilot signal upconverter 638 and the pilot signal cancellation path 640, under control of DSP 642 as in the embodiment of FIG. 4.

A portion of the RF output is tapped by coupler 644 and fed into a feedback path 648, which involves filtering to remove the main output signal and additional mixing processes as described with reference to the embodiment of FIG. 4 to provide a feedback signal to both the DSP 642 and the correlator 650. This feedback signal contains information regarding the cross-modulation distortion imposed on the pilot signal by the main signal, and the DSP 652 utilises this signal to adjust the predistortion to suppress the cross-modulation imposed on the injected pilot, and hence the intermodulation distortion experienced by the wanted output signals.

The signals I2 to I6 and Q2 to Q6 are even-order baseband outputs from the non-linearity generators 618, 628, and are used by the mixers of the correlator 650 to produce the "J" and "R" signals (which are audio-frequency tones resulting from the correlation processes) and provide inputs to DSP 652 at the points shown. The DSP 652 operates in a manner like that of the DSP 480 in FIG. 4, and its integrators produce output signals which are used to control the non-linearity generators 618 and 628.

Figure 7A:
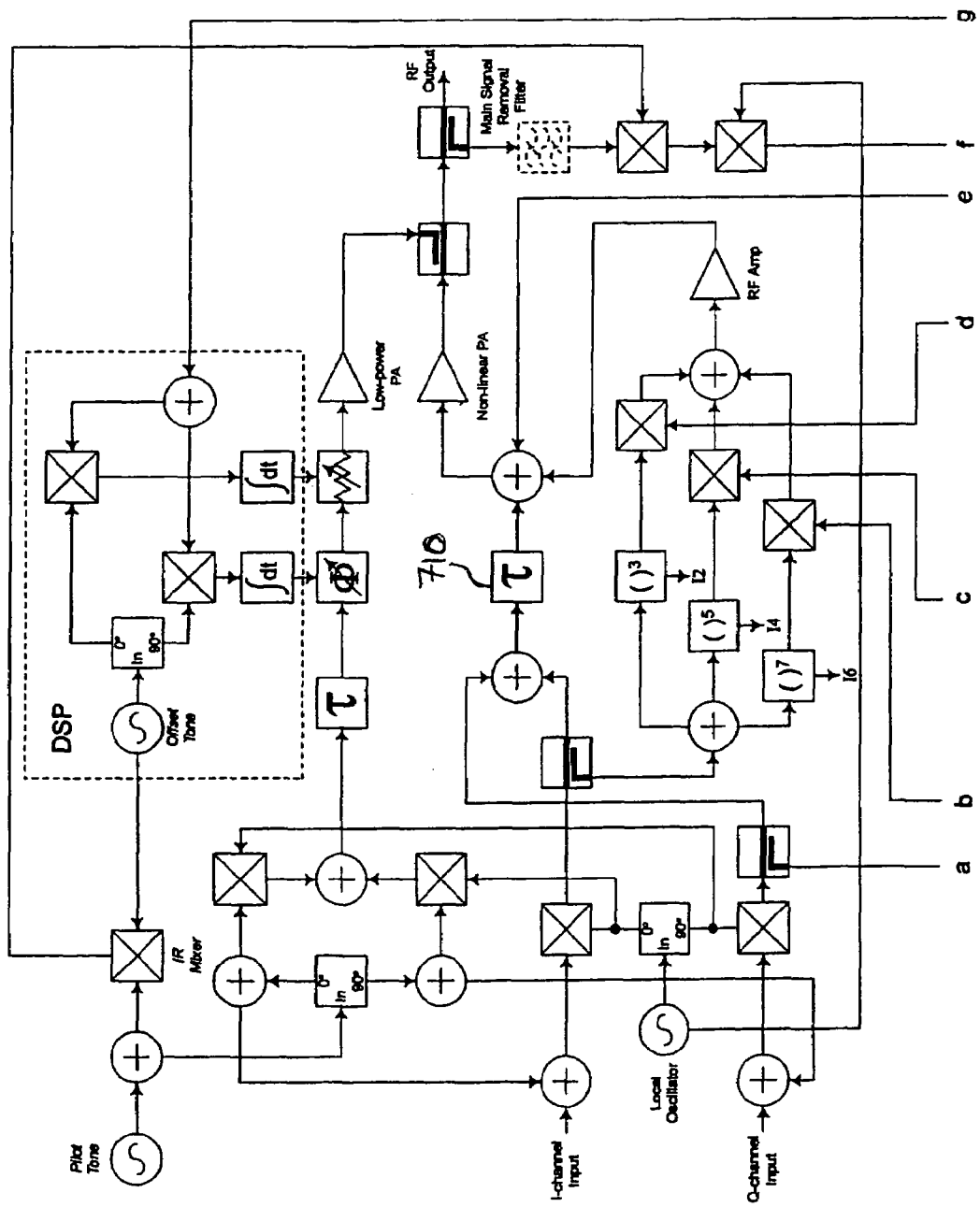
FIGS. 7a and 7b show an alternative version of the circuit shown in FIG. 6 utilising a single delay line in the main signal path.
Figure 7B:
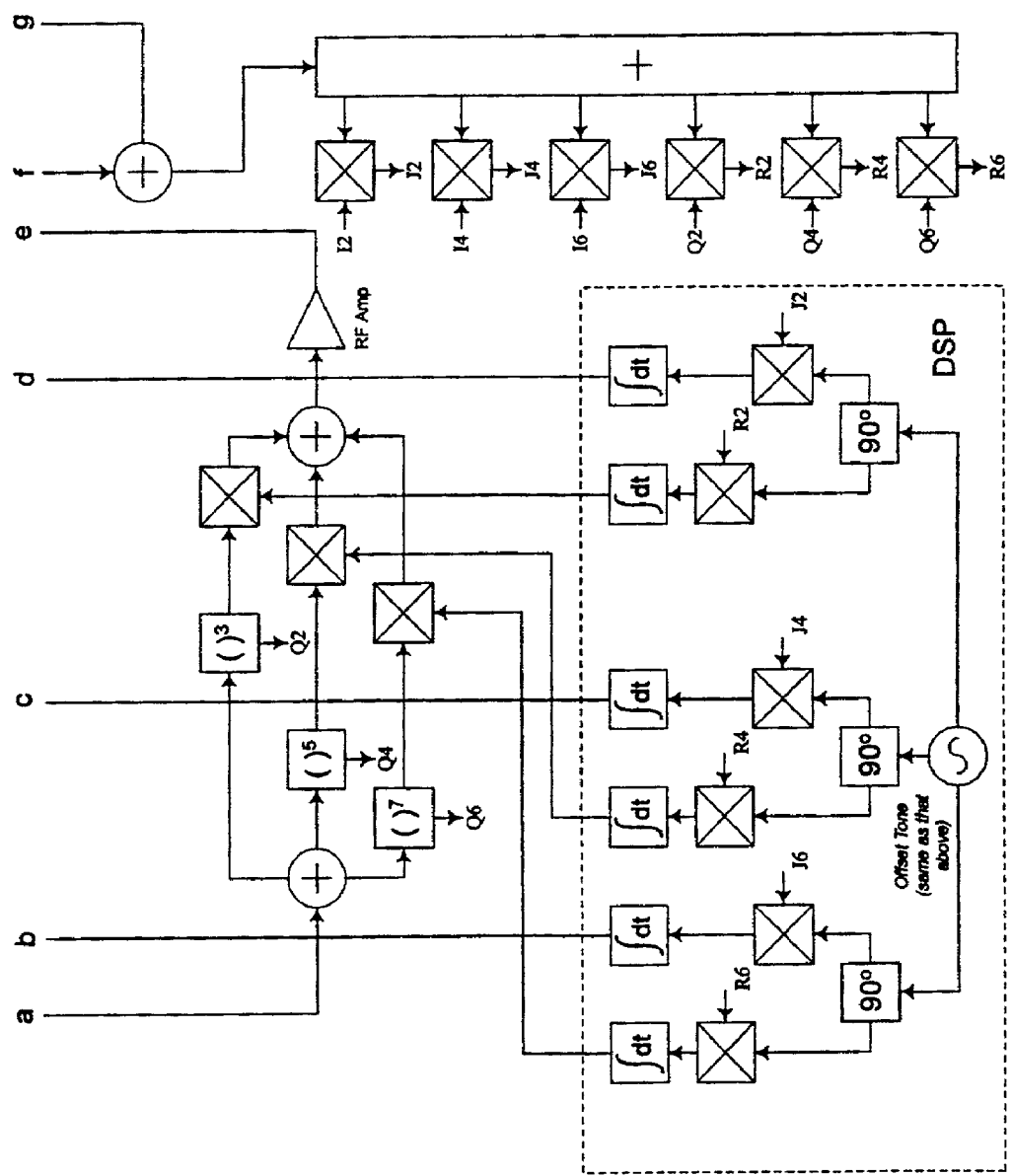

A further alternative is shown in FIG. 7 involving only a single delay-line 710 in the main signal path in place of the delay lines 620 and 630 used in FIG. 6. Since it is likely that the majority of the low-power signal processing for this system will be fabricated in an integrated circuit, the delays involved will be very small and closely-matched between the I and Q paths and hence the delay line could ideally be formed using a short length of track on the printed circuit board.

Figure 8:
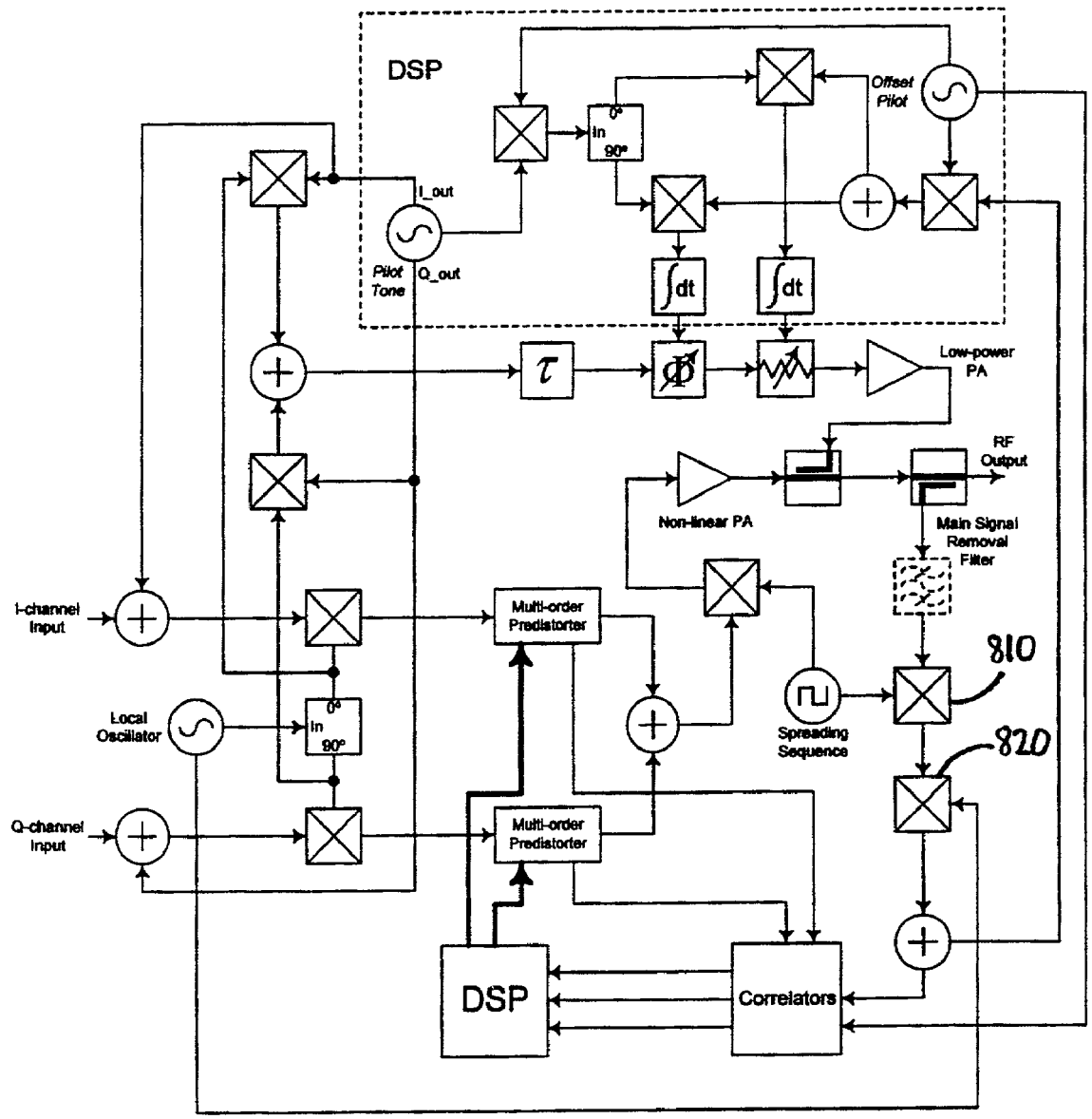

It is possible to provide direct-sequence CDMA output signals by generation of appropriate signals in I and Q components at baseband. Whilst this approach has many advantages, it does have the disadvantage that the DSP processing and digital to analogue conversion processes required need to be wideband (2.5 MHz each for a 5 MHz CDMA channel bandwidth). The alternative, and more conventional, approach involves spreading of the upconverted narrowband baseband information prior to RF power amplification. It is possible to employ the predistortion technique described herein in this type of system by including the modifications shown in FIG. 8 to the embodiment of FIG. 5. The modifications simply involve de-spreading of the feedback signal prior to processing by the control circuitry. The de-spreader 810 follows the output sampling coupler, however, it could be located at number of points in the down-conversion chain (e.g. following the downconversion mixer 820). It could even be used to upconvert the reference signals coming from the non-linearity outputs (2nd, 4th, 6th orders etc.), with the correlation processes then taking place between two spread signals in each case.

It will be appreciated that in the embodiments discussed above, digital-to-analogue conversion takes place prior to the I and Q inputs of the upconverter/amplifier combination. Increasingly, however, upconversion is occurring digitally and this has the advantage that "perfect" quadrature may be obtained, hence providing a very high degree of image rejection in the upconversion process. A single D/A converter can then be used at an IF (e.g. 10.7 MHz) providing a composite signal for upconversion by conventional means. The postdistortion/predistortion technique described above can also be applied in this case, as it will provide linearisation of the D/A converter, upconversion mixer(s), and IF amplification and the final RF power amplification. The pilot-tone may either be injected digitally in the I and Q signals (after modulation) or after D/A conversion at the IF frequency (in which case the D/A conversion process itself will not be linearised).

Power control can be provided either at baseband in the I and Q signal paths (within the DSP processing or externally by analogue means) or at RF or a combination of the two. Only the specifics of RF power control as applied to the predistortion technique described herein will be set forth.

Figure 9A:
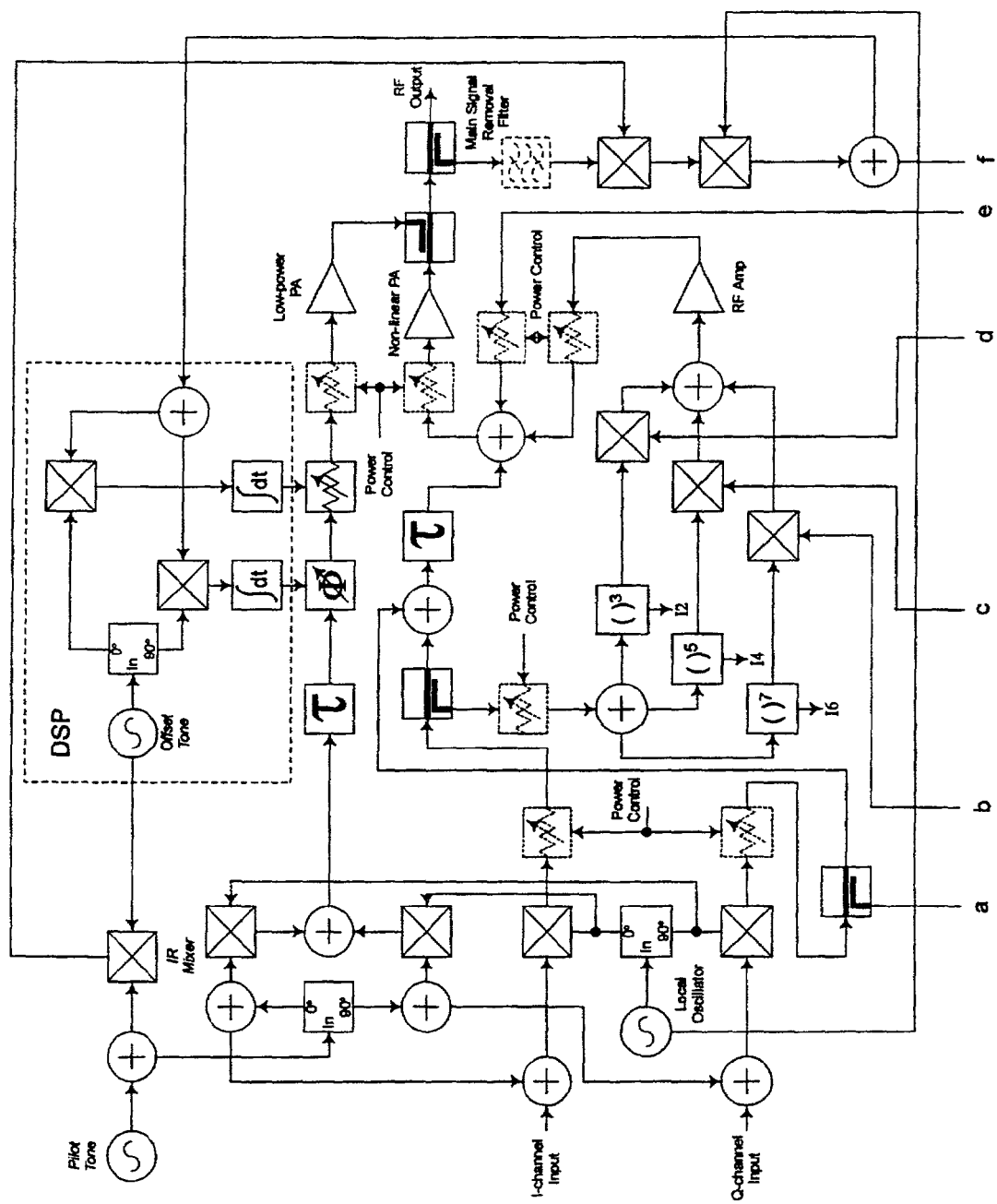
FIGS. 9a and 9b illustrate some possible RF power control positions for a polynomial postdistorter/predistorter.
Figure 9B:
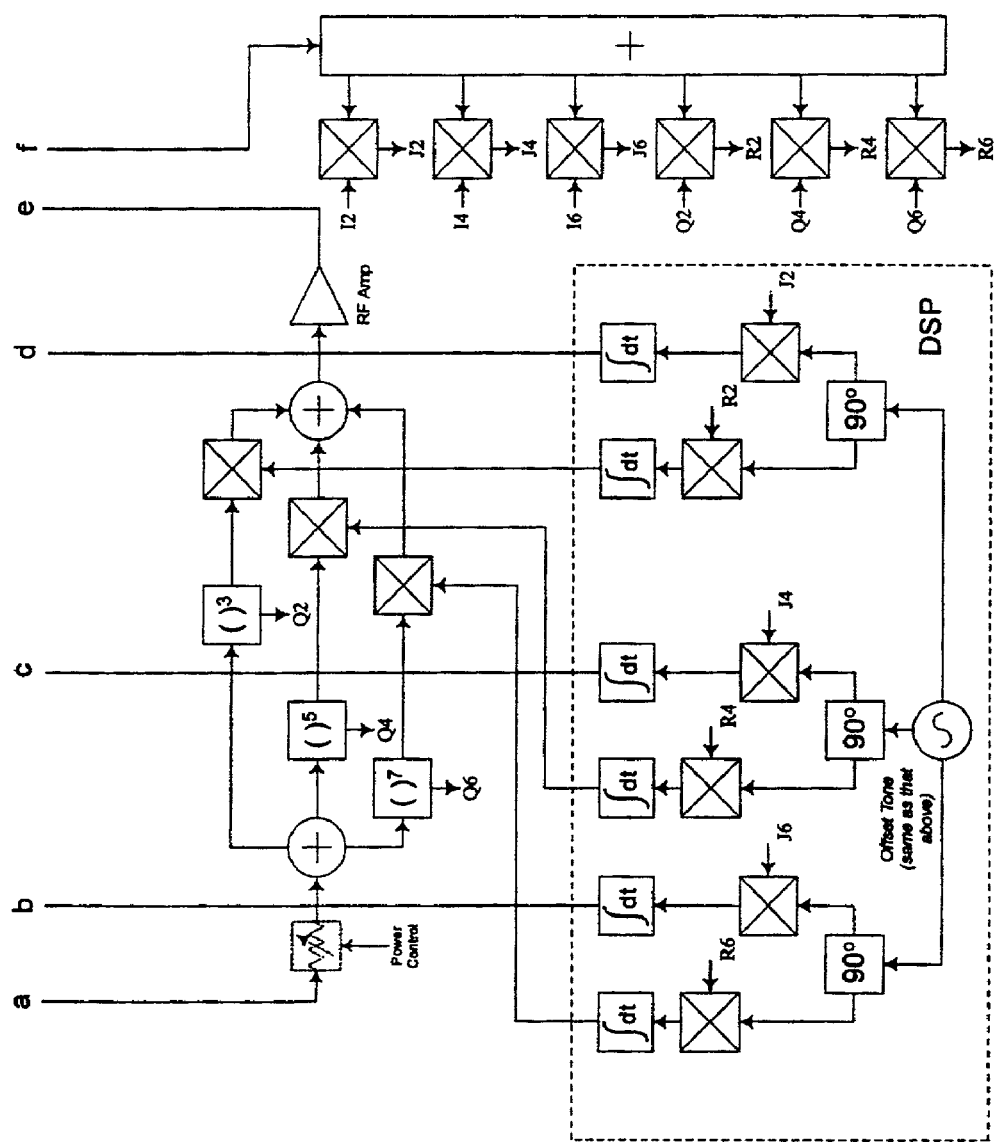

RF power control may be provided at any or all of the positions shown in FIG. 9. A key feature is that the pilot cancellation signal must be controlled in equal steps with the wanted signal steps (or at least sufficiently close such that the variable attenuator range in the pilot cancellation signal path is not exceeded).

In the case of an ideal non-linear amplifier, obeying the usual back-off rules, the power control could be provided directly following the upconversion mixers in FIG. 9. Many power amplifiers, however, do not exhibit the expected reduction in IMD levels with a given amount of input (and hence output) power reduction. In this case, some control of the level of the composite or individual distortion signals may be required (e.g. in the positions shown in FIG. 9, or prior to each of the individual order non-linearities). The resolution and precision of this control will depend upon the range of the variable gain elements (multipliers) following the individual orders of distortion.

Increasing dynamic range in RF front-end receiver systems is an emerging requirement in both handset and base-station systems. In the former case, the use of software radio techniques, with the requirement for adaption between many different channel and system bandwidths over a wide range of operating frequencies, leads to a desire to remove RF front-end filtering.

Without a front-end RF filter, a wide range of signals, both very strong and very weak, can enter the receiver. These must be processed (i.e. amplified and downconverted) without undue distortion, since otherwise unwanted intermodulation products could be produced on the wanted channel which may mask the wanted signal. A pre/post distorter can be used to provide receiver systems capable of processing received signals in the absence of front-end RF filtering with acceptable levels of distortion.

Figure 10:
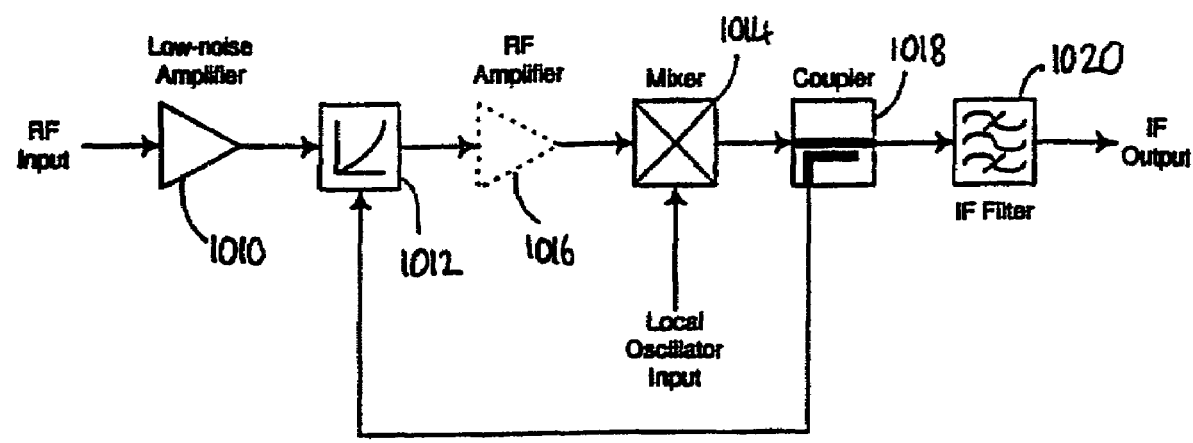
FIG. 10 shows a low noise amplifier/mixer cascaded linearisation scheme.

FIG. 10 shows a block diagram of the basic circuitry for performing linearisation of a cascaded low-noise amplifier and a mixer, such as may be used in a mobile communications handset. The received radio frequency signal is input to a low-noise amplifier 1010. The resulting amplified signal is supplied to distortion generator 1012, which supplies a predistorted signal to mixer 1014, optionally by way of radio frequency amplifier 1016. The other input to mixer 1014 is supplied by a local oscillator in order to perform the necessary downconversion of the signal. The downconverted signal passes through a coupler 1018 to IF filter 1020, the output of which provides the IF output of the amplifying and downconverting circuit. The coupler 1018 returns a portion of the output of the downconverting mixer 1014 to the distortion generator 1012 as a feedback signal. The distortion generator 1012 uses this feedback to adjust the nature of the distortion applied in order to maintain the linear nature of the IF output. It will be apparent that distortion generator 1012 acts as a postdistorter for the low-noise amplifier (or its earlier stages) and as a predistorter for downconverting mixer 1014 and optionally RF amplifier 1011.

Figure 11:
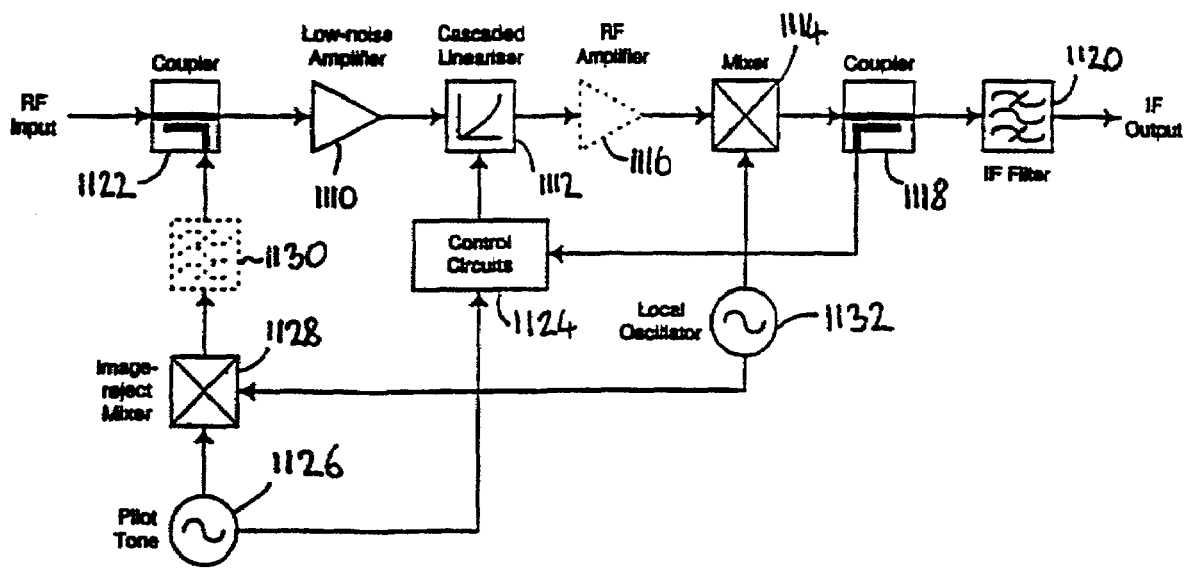
FIG. 11 illustrates the application of pilot signal based control to the circuitry of FIG. 10.

FIG. 11 shows the use of pilot based control applied to the circuitry of FIG. 10. Circuit elements described with reference to FIG. 10 will not be described again in detail and will be assigned analogous reference numerals prefixed 11 instead of 10. With reference to FIG. 11, it will be noted that the RF input signal passes through coupler 1122 prior to amplification by low-noise amplifier 1110. The purpose of coupler 1122 is to inject a pilot signal into the main signal path. Coupler 1118 provides a feedback signal to control circuits 1124. The control circuits 1124 assess the degree of cross-modulation distortion appearing on the pilot signal in the output from downconverting mixer 1114, and adapt the distortion generated at 1112 in order to minimise the residual cross-modulation distortion apparent on the pilot signal at the output and hence the IMD experienced by the wanted signals. The pilot signal is generated by way of pilot tone generator 1126, which also supplies a signal to one input of image reject mixer 1128, the output of which provides the injected pilot signal (optionally by way of filter 1130). The second input to image reject mixer 1128 is provided by local oscillator 1132 which also supplies the signal used by mixer 1114 to downconvert the input RF signal. In the amplifier/downconverter circuitry of FIGS. 10 and 11, the predistorter would need to be a quadrature system in order to linearise a non-linear, low-noise amplifier to a high degree of linearity. The quadrature splitting arrangement would have to operate on the modulated carrier and hence could not be a doubler/divider arrangement and would thus be more difficult to integrate successfully, particularly if the system is a broadband system.

Figure 12:
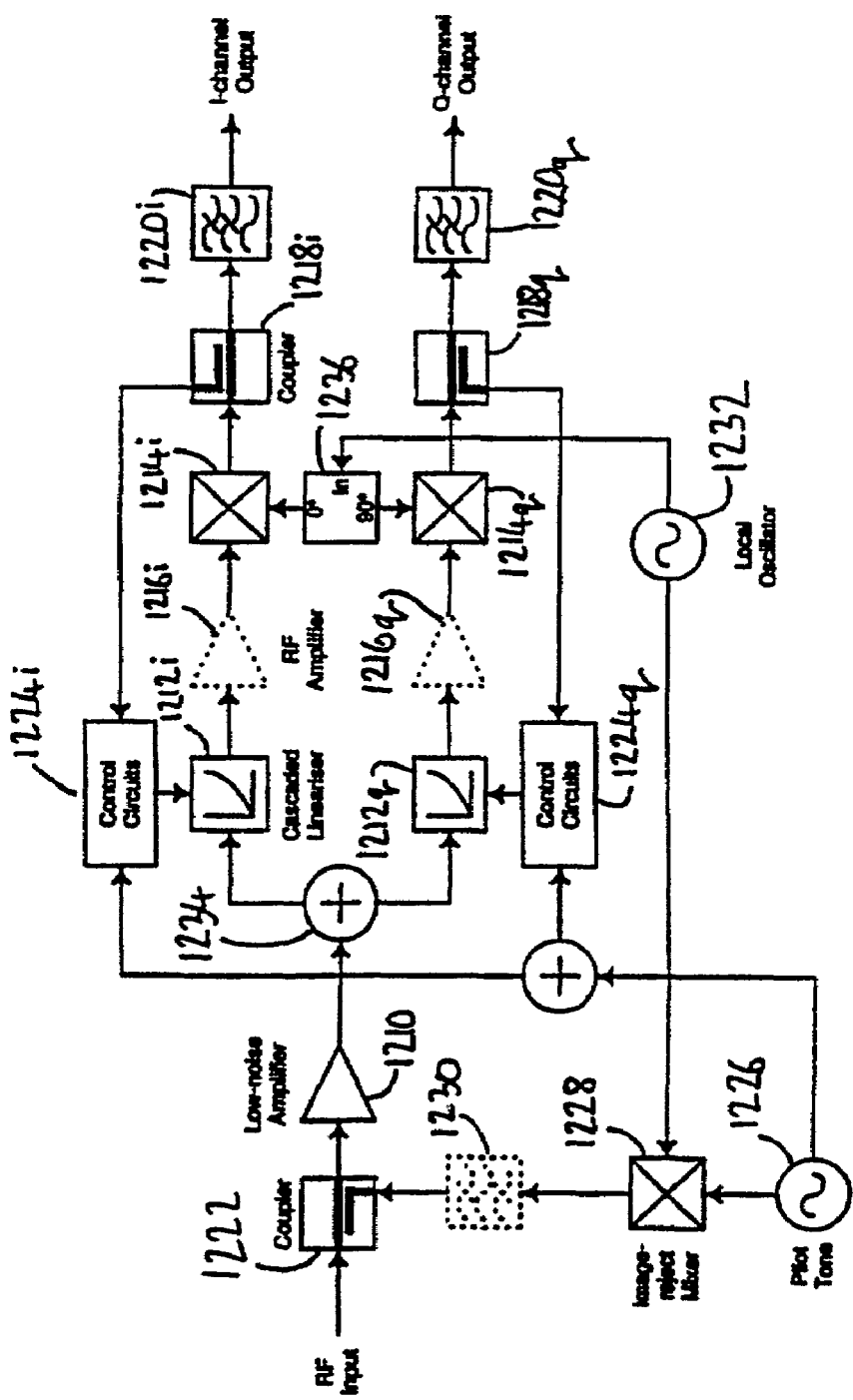
FIG. 12 illustrates a quadrature low noise amplifier/mixer cascaded linearisation scheme.
Figure 13:
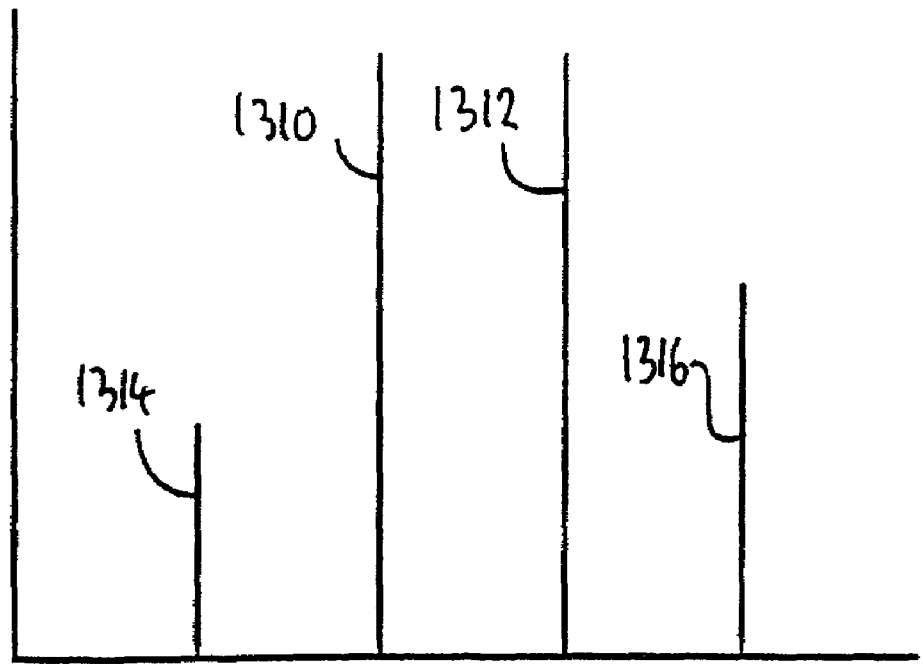
FIG. 13 illustrates unequal third order intermodulation distortion products arising in a two-tone test.

FIG. 12 shows an amplifying/downconverting circuit using a quadrature predistorter operating on a quadrature downconverter. The advantage of this arrangement is that the quadrature generation may be accomplished simply, by means of a conventional frequency doubler/divider arrangement on the local oscillator signal. Therefore, an integrated circuit implementation could be broadband and would not require a quadrature hybrid splitter, or the like. Circuit elements in FIG. 12 which have been carried over from FIG. 11 will not be described in detail and will be prefixed 12 instead of 11. The circuit of FIG. 12 has separate I and Q predistorter and downconverter channels. Each channel operates in a fashion analogous to the predistorter and downconverting mixer combination shown in FIGS. 10 and 11. The signal produced by low-noise amplifier 1210 is split at 1234 and supplied to both channels of the quadrature combined predistorter and downconverter. The circuit also comprises a quadrature signal generator 1236 fed by the local oscillator 1232 and which provides I and Q signals to the I and Q channels, respectively. Circuitry components of the I channel are suffixed "i", and those of the Q channel, "q".

The use of a pilot-tone, e.g. as employed in FIGS. 11 and 12, inserted at the system input and monitored at the output of the downconversion mixer, allows the distortion added by any part of the LNA/mixer combination to be characterised and eliminated in a controlled manner. This pilot tone must be removed prior to entering the demodulation process and this may be simply and advantageously achieved by means of the IF or baseband filtering normally employed in the receiver system. Complex pilot cancellation techniques are therefore not required (assuming that the pilot is inserted at an appropriate frequency offset such that it falls outside of the IF bandwidth), unlike the predistorters operating in amplification/upconversion circuits.

The invention claimed is:

1. Signal processing apparatus comprising:
   a signal amplifier and a frequency converter which operate in succession on an input signal,
   a pilot signal generator adapted to introduce a pilot signal into the input signal prior to frequency conversion and amplification, and
   a lineariser which is provided between the amplifier and the frequency converter to introduce a correction signal that is adapted to make the overall input and output characteristic of the apparatus more linear by linearising both the amplifier and frequency converter, wherein:
      a feedback signal, derived from the output of the apparatus and containing distortion components from the pilot signal produced by at least one of the frequency converter and the amplifier, is used by the lineariser to adapt the correction signal,
      the pilot signal is removed from the output of the apparatus by a filter or by the introduction of a pilot cancellation signal,
      the lineariser comprises a distortion generator for producing the correction signal from the output signal of whichever of the amplifier and the frequency converter precedes it, and
      the distortion generator comprises a non-linearity generator arranged to generate a third-order non-linearity by mixing the input to the non-linearity generator with itself and then with its input.

2. A signal processing apparatus according to claim 1, wherein the pilot signal is one of a CW carrier signal, a full carrier AM signal, a suppressed carrier AM, signal a single sideband signal, a quadrature amplitude modulated signal, a filtered quadrature phase shift keyed signal, a direct sequence spread spectrum signal, and a frequency hopped carrier signal modulated with any of the foregoing kinds of signal.

3. Signal processing apparatus according to claim 1, wherein the pilot signal is one of a two-tone pilot signal and a multi-tone pilot signal.

4. Signal processing apparatus according to claim 1, wherein the pilot cancellation signal is adjusted using feedback derived from the output of the apparatus.

5. Signal processing apparatus according to claim 1, wherein the pilot cancellation signal comprises a frequency converted, phase shifted and amplitude adjusted version of the pilot signal.

6. Signal processing apparatus according to claim 1, wherein a digital signal processor is used to control the pilot cancellation signal using feedback from the output of the signal processing apparatus.

7. Signal processing apparatus according to claim 1, further comprising a suppressor for cancelling signals which are images of the pilot signal.

8. Signal processing apparatus according to claim 1, wherein a digital signal processor is used to control the correction signal using feedback from the output of the signal processing apparatus.

9. Signal processing apparatus according to claim 1, wherein the non linearity generator uses at least one of anti-parallel diodes, a FET channel, dual gate GaAsFETs operating close to pinch-off, Shottky diodes, mixers and multipliers in the non-linearity generating process.

10. Signal processing apparatus according to claim 1, wherein components of the non-linearity are generated and controlled separately.

11. Signal processing apparatus according to claim 10, wherein in-phase and quadrature signals are produced from each separately generated non-linearity component and are controlled separately.

12. Signal processing apparatus according to claim 1, wherein the frequency converter comprises a mixer for mixing a mixing signal into a received signal destined to be frequency converted.

13. Signal processing apparatus according to claim 1, wherein the frequency converter is an upconverter for converting an intermediate frequency band signal into a radio frequency band signal.

14. Signal processing apparatus according to claim 13, wherein the frequency converter comprises in-phase and quadrature signal paths for handling in-phase and quadrature signals representing a signal at the intermediate frequency band, wherein there is a separate, independently controlled, lineariser operating on each of these signal paths.

15. Signal processing apparatus according to claim 1, wherein the frequency converter is a downconverter for converting a radio frequency band signal into an intermediate frequency band signal.

16. Signal processing apparatus according to claim 15, wherein the frequency converter comprises in-phase and quadrature signal paths for handling in-phase and quadrature signals representing a signal at the intermediate frequency band, wherein there is a separate, independently controlled, lineariser operating on each of these signal paths.

17. Signal processing apparatus according to claim 1, wherein the input signal is a CDMA signal.

18. Signal processing apparatus according to claim 1, wherein the pilot signal is removed from the output of the apparatus by the filter.

19. Signal processing apparatus according to claim 1, wherein the pilot signal is removed from the output of the apparatus by the introduction of the pilot cancellation signal.

20. A method of processing an input signal to produce an output signal, the method comprising the steps of:
   signal amplification and frequency conversion,
   introducing a pilot signal into the input signal prior to frequency conversion aid amplification,
   introducing, between the steps of amplification and frequency conversion, a correction signal that is adapted to make the overall input and output characteristic of the signal processing method more linear by linearising both the amplification and frequency conversion,
   using a feedback signal, derived from the output signal of the signal processing method and containing distortion components from the pilot signal produced by at least one of the frequency conversion and amplification steps, to adapt the correction signal, and
   removing the pilot signal from the output signal of the method by filtering or by introducing a pilot cancellation signal, wherein:

the correction signal is produced by a step of distorting the signal produced by whichever of the amplifying and frequency conversion steps precedes it, and distorting the signal comprises generating a third-order non-linearity by mixing the input signal with itself and then with the input signal.

21. A method according to claim 20, comprising the step of adjusting the pilot cancellation signal using feedback derived from the output signal of the signal processing method.

22. A method according to claim 20, wherein the step of distortion generation comprises the step of generating and controlling non-linearity components independently.

23. A method according to claim 20, wherein the input signal is a CDMA signal.

24. A method according to claim 20, further comprising the step of removing the pilot signal from the output signal of the method by filtering.

25. A method according to claim 20, further comprising the step of removing the pilot signal from the output signal of the method by introducing the pilot cancellation signal.

26. Signal processing apparatus comprising a signal amplifier and a frequency converter which operate in succession on an input signal, and a lineariser which is provided between the amplifier and the frequency converter to introduce a correction signal that is adapted to make the overall input and output characteristic of the apparatus more linear by linearising both the amplifier and frequency converter, wherein:

the lineariser comprises a distortion generator for producing the correction signal from the output signal of whichever of the amplifier and the frequency converter precedes it, and the distortion generator comprises a non-linearity generator arranged to generate a third-order non-linearity by mixing the input to the non-linearity generator with itself and then with its input.

27. Signal processing apparatus according to claim 26, wherein the non linearity generator uses at least one of anti-parallel diodes, a FET channel, dual gate GaAsFETs operating close to pinch-off, Shottky diodes, mixers and multipliers in the non-linearity generating process.

28. Signal processing apparatus according to claim 26, wherein components of the non-linearity are generated and controlled separately.

29. Signal processing apparatus according to claim 28, wherein in-phase and quadrature signals are produced from each separately generated non-linearity component and are controlled separately.

30. A method of processing an input signal to produce an output signal, the method comprising the steps of signal amplification and frequency conversion, and the step of introducing a correction signal that is adapted to make the overall input and output characteristic of the signal processing method more linear by linearising both the amplification and frequency conversion, wherein:

the correction signal is introduced between the step of signal amplification and the step of frequency conversion;

the correction signal is produced by a step of distorting the signal produced by whichever of the amplifying and frequency conversion steps precedes it, the step of distortion generation comprises the step of generating and controlling non-linearity components independently, and the step of distortion generation comprises generating a third-order non-linearity by mixing the input signal with itself and then with the input signal.

31. Signal processing apparatus comprising:

a signal amplifier and a frequency converter which operate in succession on an input signal, a pilot signal generator adapted to introduce a pilot signal into the input signal prior to frequency conversion and amplification, and a lineariser which is provided between the amplifier and the frequency converter to introduce a correction signal that is adapted to make the overall input and output characteristic of the apparatus more linear by linearising both the amplifier and frequency converter, wherein:

a feedback signal, derived from the output of the apparatus and containing distortion components from the pilot signal produced by at least one of the frequency converter and the amplifier, is used by the lineariser to adapt the correction signal, the pilot signal is removed from the output of the apparatus by a filter or by the introduction of a pilot cancellation signal, the lineariser comprises a distortion generator for producing the correction signal from the output signal of whichever of the amplifier and the frequency converter precedes it, the distortion generator comprises a non-linearity generator arranged to generate the non-linearity by mixing its input signal with itself one or more times to produce the non-linearity, components of the non-linearity are generated and controlled separately, and in-phase and quadrature signals are produced from each separately generated non-linearity component and are controlled separately.

* * * * *